United States Patent
Kaufmann

(10) Patent No.: US 6,473,303 B2
(45) Date of Patent: Oct. 29, 2002

(54) COOLING DEVICE FOR A HIGH-POWER SEMICONDUCTOR MODULE

(75) Inventor: Stefan Kaufmann, Lenzburg (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 09/780,510

(22) Filed: Feb. 12, 2001

(65) Prior Publication Data

US 2001/0017763 A1 Aug. 30, 2001

(30) Foreign Application Priority Data

Feb. 11, 2000 (DE) .......................... 100 06 215

(51) Int. Cl.⁷ ................................. H05K 7/20
(52) U.S. Cl. ...................... 361/699; 174/252; 165/80.4; 361/715; 361/707
(58) Field of Search ................. 174/252; 165/80.4; 257/714; 361/689, 698–699, 701–704, 707, 710, 715, 717–722

(56) References Cited

U.S. PATENT DOCUMENTS

| | | | | |
|---|---|---|---|---|
| 5,262,921 A | * | 11/1993 | Lamers | 361/699 |
| 5,349,498 A | * | 9/1994 | Tanzer et al. | 361/699 |
| 5,455,458 A | * | 10/1995 | Quon et al. | 361/699 |
| 5,666,269 A | * | 12/1997 | Romero et al. | 361/699 |
| 5,978,220 A | * | 11/1999 | Frey et al. | 361/699 |

FOREIGN PATENT DOCUMENTS

| | | |
|---|---|---|
| DE | 69126686 T2 | 2/1992 |
| DE | 19643717 A1 | 4/1998 |
| DE | 19735531 A1 | 2/1999 |
| EP | 0661917 A1 | 7/1995 |

* cited by examiner

Primary Examiner—Gregory Thompson
(74) Attorney, Agent, or Firm—Burns, Doane, Swecker & Mathis, L.L.P.

(57) ABSTRACT

A cooling device for a high-power semiconductor module has a cooler lower part (1) and a cooler upper part (2), with the cooler upper part (2) being connected to the cooler lower part (1) by an integral material connection. The cooler upper part (2) has a cooling plate (20) composed of metal matrix composite, for at least one semiconductor component (4) to be fitted to. A metal border (21) is integrally formed on the cooling plate (20) in order to allow an integral material connection between the cooler upper part (2) and the cooler lower part (1). This results in a cooling device which can be produced easily and whose cost is low.

18 Claims, 1 Drawing Sheet

COOLING DEVICE FOR A HIGH-POWER SEMICONDUCTOR MODULE

FIELD OF THE INVENTION

The invention relates to the field of power electronics. It relates specifically to a cooling device for a high-power semiconductor module as claimed in the preamble claim 1, and to a method for producing such a cooling device, as claimed in the preamble of patent claim 7.

DISCUSSION OF BACKGROUND

High-power semiconductor modules, such as those that are known from EP-A-0,597,144, have a number of semiconductor components (for example thyristors, IGBTs or diodes) which are combined in a common housing to form a logical functional unit. Such high-power semiconductor modules are nowadays operated in a voltage range up to 6.5 kV, and require appropriate cooling. To this end, the semiconductor components are soldered on a common cooling device, through which a cooling liquid generally flows. Heat sinks composed of aluminum are generally used as the cooling devices. However, aluminum has the disadvantage that its thermal coefficient of expansion is not matched to the corresponding coefficients of the semiconductor components, in particular to their electrical insulation plates or to the semiconductor chips. In consequence, mechanical stresses occur which lead to fatigue in the solder layers between the semiconductor components and the cooling device, and thus to the electrical contacts becoming detached.

DE-A-196,43,717 therefore proposes a cooling device whose thermal coefficient of expansion is matched to that of the semiconductor components. A cooling device is used for this purpose which is produced from a metal matrix composite, in particular from aluminum silicon-carbide (AlSiC) or copper silicon carbide (CuSiC). The production of such a metal ceramic composite material is described, for example, in James A. Cornie, Advanced Pressure Infiltration Casting Technology Produces Near-absolute Net-Shape Metal Matrix Composite Components Cost Competitively, Materials Technology, Vol. 10, No. 34, March/April, 1995.

This cooling device preferably has cooling elements in the form of studs or ribs, in order to increase the cooling area and thus to improve the heat transfer, so that it has a relatively complex geometry. In a first embodiment, the cooling device is cast integrally from the metal matrix composite. However, cooling devices such as this are relatively expensive, since, particularly if they have complex geometries, their production is expensive and, furthermore, they are composed of relatively expensive material. In another embodiment, only a cooling plate is composed of the metal matrix composite and the remainder is manufactured from a low-cost material, in particular from plastic, with the two parts being bonded together. A disadvantage of this embodiment is that the bonded joint is subject to age-dependent fatigue phenomena.

A further cooling device is known from EP-A-0,661,917. This cooling device comprises a cooler lower part and a cooler upper part, with the cooler lower part being connected to the cooler upper part by an integral material connection. Both cooler parts are composed of a metal matrix composite (MMC), for example aluminum silicon-carbide. The integral material connection between the cooler parts is produced during the production process. For this purpose, ceramic preforms of the cooler parts are produced first of all, these are then placed one on top of the other, and metal is then infiltrated into both parts. The joint infiltration is intended to allow the metal to flow through the pores of both parts by capillary action, and thus to connect them together. Owing to the complexity of their production and owing to the choice of the material, these cooling devices are also relatively expensive. Since the quality of the connection depends on the capillary action, it is, furthermore, difficult to produce a sufficiently dense composite, depending on the shape of the cooler parts.

SUMMARY OF THE INVENTION

It is therefore an object of the invention to provide a cooling device of the type mentioned initially, which can be produced at low cost and easily.

This object is achieved by a cooling device having the features of claim 1, and by a method for producing a cooling device having the features of claim 7.

The cooling device according to the invention comprises a cooler lower part and a cooler upper part, with the cooler upper part having a cooling plate composed of a metal matrix composite, preferably aluminum-silicon carbide, on which a metal border is integrally formed. The two cooler parts are in this case connected to one another via the metal border by an integral material connection.

The cooling plate and the metal border can be manufactured in the same production step by using excess metal to form the metal border during metal infiltration of a ceramic preform in order to form the cooling plate.

The metal border which is integrally formed on the cooling plate allows a strong and long-lasting connection to be produced in a simple way between the cooler upper part and the cooler lower part. The cooler lower part can be produced from low-cost material which is easy to form and process, in particular from aluminum. Suitable choice of the material for the cooler lower part allows stresses and faults in the connection to be avoided. The cooler lower part is preferably manufactured from the same material as the cooler upper part. Friction welding is preferred as the connection method, since this leads only to a local influence from heat in the cooling device.

Such a cooling device combines the advantages of the already known cooling elements composed of metal matrix composite with the advantages of the already known aluminum cooler and can be produced simply and at low cost. The special border allows it to be connected to the cooler lower part in a simple manner, and faults can be avoided.

Further advantageous embodiments are evident from the dependent patent claims.

BRIEF DESCRIPTION OF THE DRAWINGS

The subject matter of the invention will be explained in more detail in the following text with reference to a preferred exemplary embodiment which is illustrated in the attached drawings in which.

DESCRIPTION OF THE PREFERRED EMBODIMENTS

Figure 1:
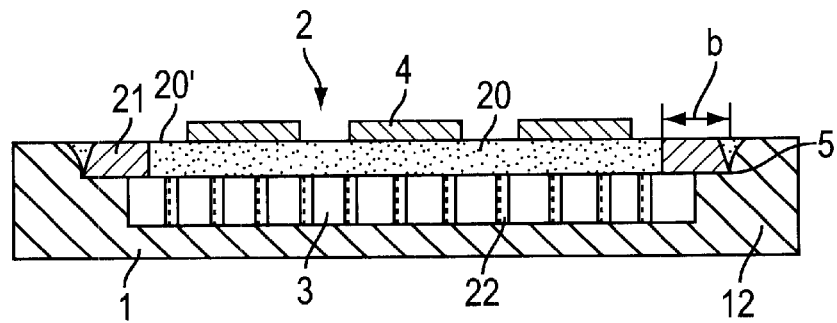
FIG. 1 shows a cross section through a cooling device according to the invention.
Figure 2:
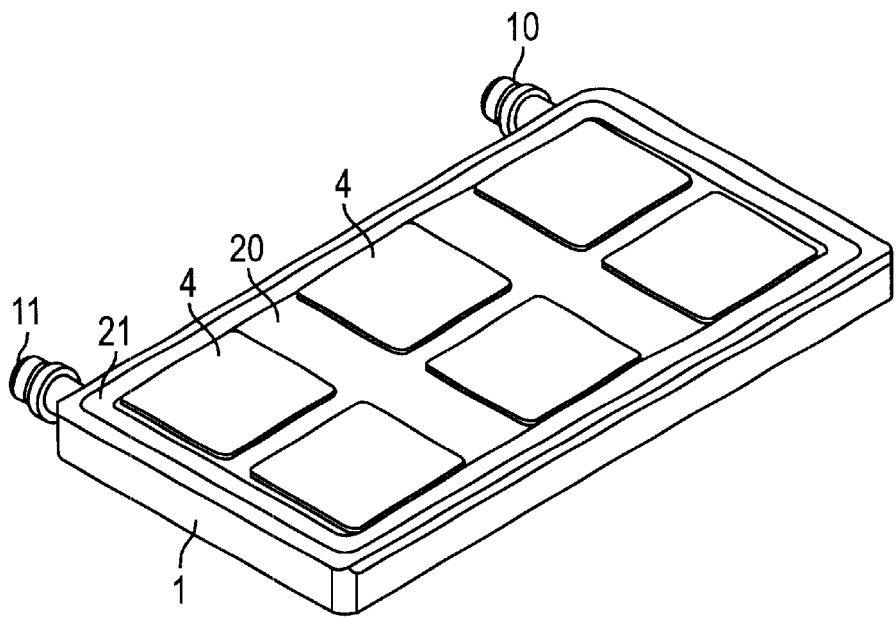
FIG. 2 shows a perspective illustration of the cooling device shown in FIG. 1 from above.

FIGS. 1 and 2 show a cooling device according to the invention. This comprises a cooler lower part 1 in the form of a half-shell and a cooler upper part 2 which is essentially in the form of a plate. The cooler upper part 1 and lower part 2 enclose a cavity 3 through which a cooling medium can preferably flow, in particular water. The inlet and outlet openings 10, 11 required for this purpose are arranged in the cooler lower part 1. The cooler lower part 1 is produced from a low-cost material which can be formed easily, in particular from a metal, for example from aluminum or copper. In the example illustrated here, the cooler lower part 1 has a rectangular outline, but other shapes are also possible.

The cooler upper part 2 has a cooling plate 20 composed of a metal matrix composite, in particular of a silicon carbide composite. The cooling plate 20 is preferably composed of aluminum silicon-carbide (AlSiC). Other materials, such as copper silicon carbide (CuSiC) or copper carbide (CuC) may, however, also be used. An upper surface 20' of the cooling plate 20, facing away from the cooler lower part 1, is designed to be planar and is used to place semiconductor components 4 on it, for example IGBTs, thyristors or diodes. The semiconductor components 4 are preferably soldered directly on to the cooling plate 20. This presents no problems, particularly if the semiconductor components 4 have a lower face composed of aluminum nitrite (AlN), since this material has a similar thermal coefficient of expansion to that of aluminum silicon-carbide (AlSiC).

Cooling elements 22 in the form of studs or cooling ribs, which are used to increase the heat transfer, are provided on the lower face of the cooling plate 20, facing the cooler lower part 1.

The cooling plate 20 is completely surrounded by a metal edge 21 on its end surfaces 20". The metal border 21 is preferably composed of the same metal as that which has already been used for the metal matrix composite, in particular of aluminum (Al). The cooler lower part 1 is preferably also composed of the same metal.

Typically thicknesses for the cooling plate 20 are 2–4 mm. The width b of the metal border is typically 5–20 mm. The metal border 21 and the cooling plate 20 are preferably of the same thickness. As shown in FIG. 2, the cooling plate 20 and the metal border 21 are shaped to be rectangular. However, other shapes are possible.

The cooler upper part 2 lies on the cooler lower part 1 and is connected to it by an integral material connection. The connection, which is annotated by 5 in FIG. 1, is in this case produced via the metal border 21.

In the exemplary embodiment illustrated here, the metal border 21 is designed to be planar and lies on a step 12 which runs round the periphery of the cooler lower part 1. However, other shapes are possible.

Figure 3:
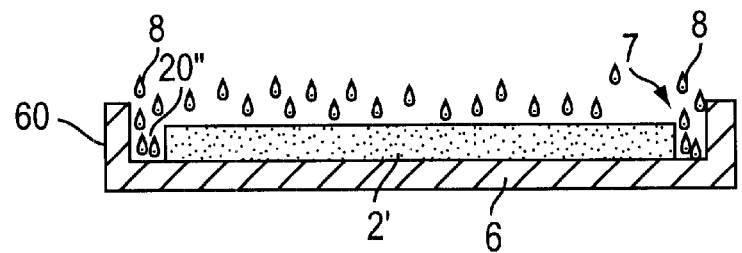
FIG. 3 shows a cross section through a mold for producing a cooling plate provided with a metal border.

The cooler upper part 2 can be manufactured in a simple way by producing the cooling plate 20 from a metal matrix composite and by the metal border 21 being integrally formed on it. The production of the metal border 21 and the production of the metal matrix composite can be carried out in the same process step. A preferred variant of the method will be described with reference to FIG. 3. A preform in the form of a porous ceramic plate 2' is placed in an excessively large mold 6 so that the end surfaces 20" of the ceramic plate 2' form an intermediate space 7, which runs around the periphery, with the walls 60 of the mold 6. As was normal in the prior art, the ceramic plate 2' is now infiltrated with metal 8. In the process, metal 8 is also cast into the intermediate space 7. The subsequent solidification of the metal results in the production firstly of the cooling plate 20, which is composed of a metal matrix composite, and, secondly, of the metal border 21. The shape of the metal border 21 can be selected by the choice of the mold 6.

To produce the cooling device, the metal border 21 of the cooler upper part 2 now just has to be connected to the lower part 1. Friction welding is suitable for this purpose, particularly if aluminum is used for the metal border 21 and the cooler lower part 1.

The cooling device according to the invention and having an AlSiC plate and the cast-on aluminum border allows low-cost and simple production and ensures a tight connection which is resistant to ageing.

LIST OF REFERENCE SYMBOLS

1 Cooler lower part (half-shell)
10 Inlet opening
11 Outlet opening
12 Step
2 Cooler upper part
2' Ceramic plate
20 Cooling plate
20' Upper surface
20" End surfaces
21 Metal border
22 Cooling elements (studs, ribs)
3 Cavity
4 Semiconductor component
5 Connection
6 Mold
60 Walls
7 Intermediate space
8 Metal
b Width of the metal border

What is claimed is:

1. A cooling device for a high-power semiconductor module, said cooling device comprising:

a lower part, said lower part being made of solid metal; and an upper part, said upper part comprising a metal matrix composite inner plate for at least one semiconductor component to be placed on it, and said upper part comprising a metal peripheral edge surrounding said plate on its periphery, said inner plate being infiltrated with metal of said peripheral edge, forming a single piece upper part;

wherein said upper part is connected to the lower part by an integral material connection between the metal peripheral edge and the lower part.

2. The cooling device as claimed in claim 1, wherein said lower part is made of a same metal as the metal peripheral edge.

3. The cooling device as claimed in claim 1, wherein said metal peripheral edge has a width in a range of from 5 to 20 mm.

4. The cooling device as claimed in claim 1, wherein said metal peripheral edge and the inner plate each have a thickness in a range of from 2 to 4 mm.

5. The cooling device as claimed in claim 1, wherein said metal peripheral edge has a width in a range of from 5 to 20 mm, and wherein said metal peripheral edge and the inner plate each have a thickness in a range of from 2 to 4 mm.

6. The cooling device as claimed in claim 1, wherein said inner plate is a cooling plate composed of Silicon-carbide composite material.

7. The cooling device as claimed in claim 1, wherein said inner plate is a cooling plate composed of Aluminum-Silicon-Carbide (AlSiC) and the metal peripheral edge is composed of Aluminum (Al).

8. The cooling device as claimed in claim 2, wherein said metal peripheral edge has a width in a range of from 5 to 20 mm.

9. The cooling device as claimed in claim 2, wherein said metal peripheral edge and the inner plate each have a thickness in a range of from 2 to 4 mm.

10. The cooling device as claimed in claim 2, wherein said metal periphery edge has a width in a range of from 5 to 20 mm, and wherein said metal peripheral edge and the inner plate each have a thickness in a range of from 2 to 4 mm.

11. The cooling device as claimed in claim 2, wherein said inner plate is a cooling plate composed of Silicon-carbide composite material.

12. The cooling device as claimed in claim 2, wherein said inner plate is a cooling plate composed of Aluminum-Silicon-Carbide (AlSiC) and the metal peripheral edge is composed of Aluminum (Al).

13. A cooling device for a semiconductor module, said cooling device comprising:

a lower part entirely made of a first material; and an upper part for receiving at least one semiconductor component, the upper part comprising an inner plate formed of a second material, and comprising a peripheral edge formed of the first material about the inner plate, said inner plate being infiltrated with the first material to form the upper part as a single piece, said upper part being connected to the lower part by an integral material connection between the peripheral edge and the lower part.

14. The cooling device as claimed in claim 13, wherein said peripheral edge has a width in a range of from 5 to 20 mm.

15. The cooling device as claimed in claim 13, wherein said peripheral edge and the inner plate each have a thickness in a range of from 2 to 4 mm.

16. The cooling device as claimed in claim 13, wherein said peripheral edge has a width in a range of from 5 to 20 mm, and wherein said peripheral edge and the inner plate each have a thickness in a range of from 2 to 4 mm.

17. The cooling device as claimed in claim 13, wherein said inner plate is a cooling plate composed of a Silicon-carbide composite material.

18. The cooling device as claimed in claim 13, wherein said inner plate is a cooling plate composed of Aluminum-Silicon-Carbide (AlSiC) and the peripheral edge is composed of Aluminum (Al).

* * * * *